United States Patent [19]

van der Meij

[11] Patent Number: 4,864,280

[45] Date of Patent: Sep. 5, 1989

[54] FLEXIBLE DETECTION LABEL

[75] Inventor: Daniël A. van der Meij, Enschede, Netherlands

[73] Assignee: N. V. Netherlandsche Apparatenfabriek Nedap, De Groenlo, Netherlands

[21] Appl. No.: 156,807

[22] Filed: Feb. 17, 1988

[30] Foreign Application Priority Data

Feb. 17, 1987 [NL] Netherlands ............... 8700388

[51] Int. Cl.⁴ ................ G08B 13/14; H01Q 1/36
[52] U.S. Cl. ................................ 340/572; 343/895
[58] Field of Search .............. 340/572; 343/895; 361/402

[56] References Cited

U.S. PATENT DOCUMENTS

| | | | |
|---|---|---|---|
| 3,810,147 | 5/1974 | Lichtblau | 340/572 |
| 3,863,244 | 1/1975 | Lichtblau | 340/572 |
| 4,021,705 | 5/1977 | Lichtblau | 340/572 X |
| 4,369,557 | 1/1983 | Vandebult | 340/572 X |
| 4,598,276 | 7/1986 | Tait | 343/895 X |
| 4,658,264 | 4/1987 | Baker | 343/895 |
| 4,686,517 | 8/1987 | Fockens | 340/572 |
| 4,694,283 | 9/1987 | Reeb | 340/572 |
| 4,717,438 | 1/1988 | Benge et al. | 340/572 X |

FOREIGN PATENT DOCUMENTS 8301697 5/1983 Fed. Rep. of Germany ...... 340/572

Primary Examiner—Glen R. Swann, III
Assistant Examiner—Thomas J. Mullen, Jr.
Attorney, Agent, or Firm—Fleit, Jacobson, Cohn, Price, Holman & Stern

[57] ABSTRACT

A flexible carrier having on both opposite surfaces thereof foil films forming conductor tracks as inductance coils insulated from each other by the carrier. Each track is connected at opposite ends to a conductive region of the foil film to form electrodes for two capacitors establishing one resonant circuit. The coil forming tracks on opposite side surfaces of the carrier are arranged to accommodate relatively large capacitor electrodes of substantially equal dimensional area.

8 Claims, 1 Drawing Sheet

FLEXIBLE DETECTION LABEL

BACKGROUND OF THE INVENTION

This invention relates to a flexible detection label for an electronic detection system, comprising a thin, plate-like flexible carrier having on both sides elements made from flexible material, jointly forming at least one resonant circuit.

Such labels may be used, e.g. in a shop-lifting detection system, as described e.g. in U.S. Pat. No. 4,686,517 (Nedap). The resonant circuit includes at least one coil and at least one capacitive element, jointly forming the operating frequency of the label.

The resonant circuit may consist e.g. of a flexible coil of metal foil on a sheet of paper or on a foil of synthetic plastics material, functioning as a carrier. The coil may be made e.g. by etching from aluminum foil or by means of printing techniques or any of the other techniques known therefor. The coil is connected to a capacitor whose one electrode is disposed on the same surface of the carrier as the coil, and is connected to one end of the coil. The other electrode of the capacitor is provided on the other surface of the carrier and is connected to the other end of the coil by means of an interconnection through the carrier or around the edge of the carrier.

U.S. Pat. No. 4,694,283 to Reeb discloses a flexible identification label consisting of a conductor configuration provided on one of the surfaces of a carrier of paper, synthetic plastics material or cardboard, said configuration extending on both sides of at least one fold line and having a conductor track bridging the fold line. By doubling up the carrier with the conductor configuration thereon along the fold line, there is produced an assembly of two opposite sub-configurations, each forming a coil having a capacitor face on at least one end. In the folded condition, the capacitor faces of the two sub-configurations form one capacitor. The two sub-configurations are electrically interconnected by the conductor track bridging the fold line.

A drawback of this known label is that the electrical properties of such a folded label depend strongly on the exact location of the fold line. Consequently, the fold line should be defined as accurately as possible, which is effected by means of perforations or ridges. However, this entails the risk that the conductor track bridging the fold line is interrupted entirely or partly. Furthermore, during the further handling of such a label, a conductor track bridging an outer edge is rather vulnerable.

U.S. Pat. No. 4,658,264 to Baker describes various techniques for defining the fold line of a folding label as accurately as possible. However, the above described drawbacks apply just as well to the labels described in that publication.

It is observed that both the Reeb and Baker patents aforementioned describe embodiments wherein the sub-configurations on opposite sides of the fold line are not connected by a conductor track bridging the fold line. In the folded condition, the two sub-configurations are then coupled exclusively capacitively. In the known configurations, however, this capacitive coupling is defined substantially by the conductor tracks forming the coils. Sometimes, even, the parasitic capacitive coupling of the conductor tracks forming the coils is used only. Needless to say that in that case, even a very small deviation during folding may result in a substantial variation in the resonate frequency of the label. Moreover, the coil and the capacitive element can then no longer be designed independently from one another in an optimal manner, given the desired resonate frequency.

The Reeb patent shows an embodiment wherein opposite spiral conductor tracks have inner ends enlarged to form a capacitor electrode. As a result, true, the freedom of design is somewhat increased, but the effective coil surface area is reduced.

The major problem of the construction of these flexible labels is to ensure that the effective coil area is as large as possible with slight outer dimensions, as well as to achieve that the quality factor Q of the circuit is as high as possible. The effective coil area defines the coupling factor with the transceiver coil and hence the detection sensitivity.

The loss resistance in the coil, i.e. the resistance of the tracks, defines substantially the quality factor Q of the resonant circuit.

A high quality factor Q requires a low resistance of the tracks and hence a large track width. Broad tracks, however, result in a smaller effective coil area.

It is therefore an important object of the present invention to provide an improved detection label.

SUMMARY OF THE INVENTION

According to the present invention, a flexible detection label of the previously described type is characterized in that the resonant circuit includes at least two conductor tracks formed as coils, said tracks being insulated from each other and disposed on opposite surfaces of the carrier, each track having two ends connected to a conductive region forming a capacitor electrode, and that the two capacitor electrodes on one surface of the carrier are exactly opposite corresponding capacitor electrodes on the other surface of the carrier, and that opposite capacitor electrodes are substantially equally large.

BRIEF DESCRIPTION OF DRAWING FIGURES

The invention will now be described in more detail with reference to the accompanying drawings, in which.

DETAILED DESCRIPTION OF PREFERRED EMBODIMENT

Figure 1:
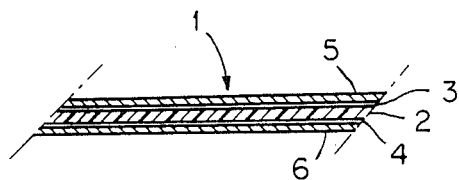
FIG. 1 is a diagrammatic cross section of a detection label according to the present invention.

FIG. 1 is a diagrammatic, part-cross-sectional view of a flexible detection label 1 according to the present invention. The label 1 comprises a carrier 2 made from an electrically insulating material. Carrier 2 is plate-shaped and has a small thickness. The carrier is made from a material that is flexible, at least at the plate thickness chosen. The carrier may consist of synthetic plastics foil, but may also be made from paper or cardboard. On the two sides of carrier 2 there is formed a track pattern likewise of flexible, conductive material, such as aluminum foil. The respective conductive foil films are indicated in FIG. 1 at 3 and 4. On one side, there may further be provided a paper film or a film of synthetic plastics material, as shown in FIG. 1 at 5, and on the other side, e.g. an adhesive film, as indicated at 6, so that a sticker is produced. Other finishes of the outer surfaces are possible as desired. The adhesive film may be provided e.g. by means of an intermediate film. The adhesive film may be protected from premature adhesion by a detachable cover sheet. Furthermore, printing on film 5 is possible.

The track pattern for forming the coils and the capacitors in the metal foil can be made by means of e.g. etching techniques or laser cutting techniques. The capacitors of the resonant circuit are built up from the two metal foils 3 and 4 on either side of the synthetic plastics carrier 2. Because, as far as production engineering is concerned, it is difficult and/or expensive to make a reliable connection between the two metal foil films, use is made, according to the present invention, of at least two capacitors and at least two coils connected according to the equivalent diagram shown in FIG. 4. This arrangement has the advantage that the total self-inductance is divided over the two sides of the label, so that the effective coil area can be maximal at the indicated dimension of the label. Also, this self-inductance is designed so that the stray capacitance normally occurring in opposed windings has practically no effect on the resonant circuit, as will be further explained hereinafter.

Figure 4:
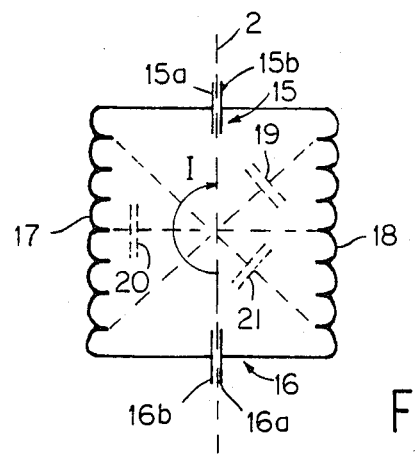
FIG. 4 shows an electrical diagram representing a detection label according to the present invention.

FIG. 4 shows the electrical diagram of a label according to the present invention. The location of the carrier 2 is indicated in FIG. 4 by a broken line. The carrier to is shown to form the dielectric between electrode forming foils 3 and 4 for establishing two capacitors 15, 16. The left-hand electrode portion 15a of the foil 3 associated with capacitor 15, together with a coil portion 17 of the foil 3 and the left-hand electrode portion 16b of the foil 3 associated with capacitor 16 are situated on one surface of carrier 2. The right-hand electrode portion 15b of foil 4 associated with capacitor 15, together with a coil portion 18 of foil 4, and the right-hand electrode portion 16a of foil 4 associated with capacitor 16 are situated on the other surface of carrier 2. Accordingly, the electrical coupling between the foils 3 and 4 consists only of the carrier 2 functioning as the dielectric of the capacitors.

In order to optimally use the two surface of the carrier, coil portions 17, 18 preferably have the same self-inductance and capacitors 15, 16 preferably have the same capacitance.

Figures 2, 3:
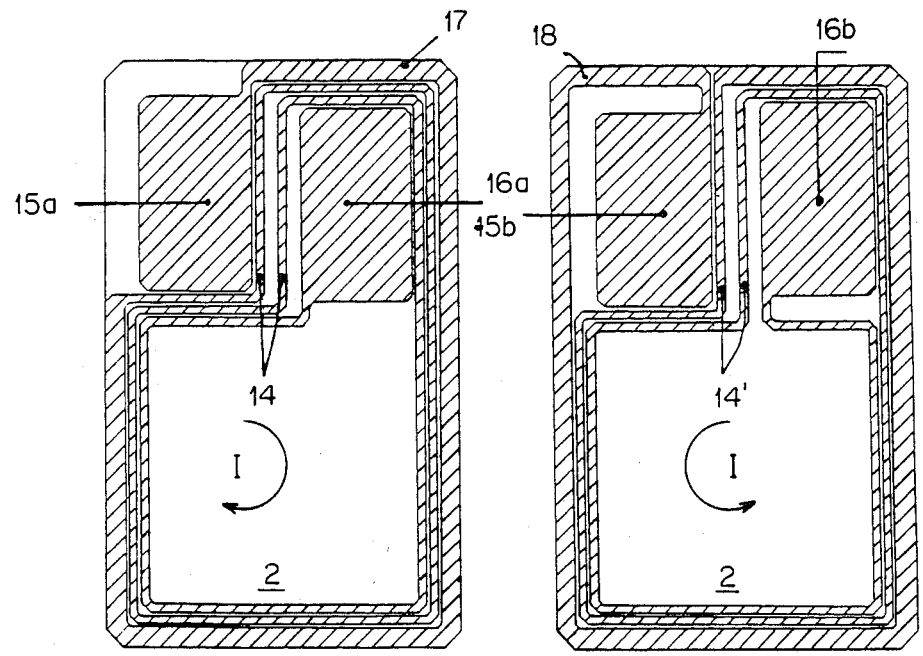
FIG. 2 is a diagrammatic top view of an example of a detection label according to the present invention.
FIG. 3 is a bottom view of the detection label shown in FIG. 2.

FIGS. 2 and 3 show, by way of example, two track patterns according to the present invention provided on either side of a carrier. FIG. 2 may be a top view of a label according to the present invention (without a cover film 5) and FIG. 3 a bottom view of the same label (likewise without a cover film 6).

FIG. 2 shows an approximately rectangular carrier 2 provided near one of the corners, in this example the left-hand top corner, with an approximately rectangular region of conductive material constituting the electrode portion 15a of the foil 3. Extending spirally from the top corner of the electrode region located near the top edge of the label, but remote from the corner of the label, and substantially along the circumference of the label, is a right-hand coiled conductor portion of foil 3 constituting the inductance coil 17. Conductor coil portion 17 terminates after some windings, in this example three, in a second approximately rectangular conductive region conststituting the electrode portion 16a provided near the right-hand top corner of the label. Conductor coil portion 17 does not enclose the first electrode 15a but it does enclose the second electrode region 16a.

Similarly, FIG. 3 shows a bottom view of the same label with an approximately rectangular conductive regions forming electrode portions 15b and 16b of the foil 4 in the top portion, both near the left-hand top corner and near the right-hand top corner. A conductor coil portion 18 extends from the top corner of electrode 15b remote from the corresponding corner of the label, substantially along the circumference of the label in the form of a left-hand coiled spiral. Conductor coil portion 18 terminates after three windings in electrode region 16b, enclosed by the conductor. Region 15b, however, is enclosed only by the outer winding of the spiral conductor coil portion 18.

Regions 15a and 15b are equally large and together form the first capacitor 15. Similarly, regions 15a and 16b together form the second, substantially identical capacitor 16. The spiral conductors and connect the two capacitors and form the desired coils 17 and 18.

Due to the configuration chosen, the current, in operation, has the same direction in superposed conductor sections, at least as far as said conductor sections follow the outer edge of the label. For the sake of clearness, FIG. 4 shows a circular current I and FIGS. 2 and 3 show the corresponding currents. Moreover, due to the configuration chosen, superposed points of the said conductor sections have substantially the same potential. This means that the stray capacitance established in principle between said conductor sections has no effect on the electrical properties of the label. The stray capacitances 19, 20, 21 shown in broken lines in FIG. 4, therefore, can be assumed to be zero.

Only the conductor sections 14, 14' of the coil portions 17 and 18 extending on each side of the carrier between the capacitor electrodes 15a, 16a, and 15b, 16b, respectively, have unequal potentials and hence give rise to undesirable stray capacitances. This effect, however, is minimized through the tracks 14, 14' being in offset relationship relative to one another, as shown in FIG. 2 and FIG. 3.

It is observed that various modifications of the above described embodiment are possible. For instance, a different number of windings can be chosen. Also, the carrier may consist of a plurality of layers. In case the carrier consists of two layers, such a carrier may even be formed by doubling up a carrier having two conductor patterns on one side. Because in that case there are no tracks bridging the fold line, a perforation, if any, is not detrimental. The bringing in register of the two patterns is simplified by the relatively large capacitor surface areas, while deviations have a relatively slight effect due to the corresponding potential variation on both sides of the carrier.

These and similar modifications will readily occur to one skilled in the art after reading the above and are thus deemed to fall within the scope of the present invention.

I claim:

1. A flexible detection label for an electronic detection system, comprising a thin, platelike flexible carrier having opposite surfaces and flexible elements on said opposite surfaces jointly forming at least one resonant circuit, at least two conductor tracks formed by said flexible elements as inductance coils, said tracks on one of the opposite surfaces of the carrier being insulated from the tracks disposed on the other of the opposite surfaces of the carrier, each of said tracks having two ends, a conductive region of said flexible elements separate from the tracks forming a discrete capacitor electrode connected to each of said two ends of the tracks, two of the capacitor electrodes on one of the opposite surfaces of the carrier being exactly aligned with the other corresponding capacitor electrodes on the other of the surfaces of the carrier, said opposite corresponding capacitor electrodes being substantially equal in area.

2. A flexible detection label as claimed in claim 1, characterized in that the electrodes and the tracks on said opposite surfaces of the carrier respectively have substantially identical electrical properties.

3. A flexible detection label as claiemd in claim 1, characterized in that the conductor tracks include portions which extend substantially along outer edges of the label and substantially in register with each other on said opposite surfaces of the carrier.

4. A flexible detection label as claimed in claim 3, characterized in that the conductor tracks on the opposite surfaces of the carrier respectively include aligned sections positioned in operative relation to the capacitor electrodes to establish substantially the same potential.

5. A flexible detection label as claimed in claim 4, characterized in that the conductor tracks include additional sections disposed on said opposite surfaces of the carrier in offset relationship with each other having substantially different potentials.

6. A flexible identification label as claimed in claim 1, characterized in that said label has an outer periphery, two of the capacitor electrodes being formed adjacent each other one each of the opposite surfaces of the carrier, said two electrodes being respectively connected to the two ends of the conductor tracks adjacent said outer periphery, said tracks forming a plurality of windings substantially following the outer periphery of the label, one of the capacitor electrodes on each of the opposite surfaces of the carrier being located outside of the conductor tracks, and said other of the capacitor electrodes being substantially enclosed by the other of the conductor tracks.

7. In a resonant circuit device formed on a flexible carrier having an outer periphery enclosing opposite surfaces, two pairs of aligned capacitor electrodes and one pair of offset inductance coils, conductive film means mounted on said opposite surfaces for establishing said electrodes on areas thereon of substantially equal and effectively maximum dimensions separate from the coils, each of the coils being formed by the film means as a plurality of winding sections enclosing one of the electrodes of one of the two pairs positioned on one of the opposite surfaces, with the other of the electrodes of the other of the two pairs being positioned outside of the windings.

8. The device as defined in claim 7, wherein said winding sections of the inductance coils extend adjacent to and along the outer periphery of the flexible carrier.

* * * * *